(12) United States Patent
Easwaran et al.

(10) Patent No.: US 10,578,666 B2
(45) Date of Patent: Mar. 3, 2020

(54) LOW-ENERGY ACTUATOR (LEA) DIODE DETECTION

(71) Applicant: TEXAS INSTRUMENTS INCORPORATED, Dallas, TX (US)

(72) Inventors: Sri Navaneethakrishnan Easwaran, Plano, TX (US); Sunil Kashyap Venugopal, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 748 days.

(21) Appl. No.: 15/213,140

(22) Filed: Jul. 18, 2016

(65) Prior Publication Data

US 2018/0017601 A1 Jan. 18, 2018

(51) Int. Cl.
*G01R 19/04* (2006.01)
*G01R 31/28* (2006.01)

(52) U.S. Cl.
CPC .................. *G01R 31/2829* (2013.01)

(58) Field of Classification Search
CPC ............... G01R 31/26; G01R 31/2607; G01R 31/2632; G01R 31/28; G01R 31/2801; G01R 31/2806; G01R 31/2812; G01R 31/2813; G01R 31/2815
See application file for complete search history.

(56) References Cited

U.S. PATENT DOCUMENTS

| | | | | |
|---|---|---|---|---|
| 3,676,767 A * | 7/1972 | Boelter | ............... | G01R 31/2607 324/762.07 |
| 4,346,347 A * | 8/1982 | Kamata | ............... | G01R 31/2632 324/762.07 |
| 6,342,791 B1 * | 1/2002 | Ichikawa | ........... | G01R 31/2632 324/762.07 |
| 8,045,317 B2 | 10/2011 | Easwaran et al. | | |
| 2004/0044498 A1 * | 3/2004 | Parker | ................ | G01R 31/2801 702/179 |
| 2005/0017583 A1 * | 1/2005 | Faggioli | ................ | H01F 7/1811 307/125 |
| 2006/0284590 A1 * | 12/2006 | Bruno | ..................... | H02P 23/24 318/812 |
| 2009/0021110 A1 * | 1/2009 | Lendaro | ............. | G02B 26/0858 310/317 |
| 2009/0219033 A1 * | 9/2009 | Schumacher | .......... | B60N 2/888 324/546 |

(Continued)

OTHER PUBLICATIONS

Wikipedia, The Free Encyclopedia, "Flyback diode," last modified Jun. 29, 2016, 4 p.

*Primary Examiner* — Huy Q Phan
*Assistant Examiner* — David B Frederiksen
(74) *Attorney, Agent, or Firm* — Lawrence J. Bassuk; Charles A. Brill; Frank D. Cimino

(57) ABSTRACT

A circuit comprises a CLVS, a LEA coupled to the CLVS, and a peak detector coupled to the CLVS and the LEA, wherein the peak detector is a switch-based peak detector. A method comprises closing a first switch for a period of time to provide a current to an actuator, opening the first switch after the period, measuring, after the opening, a voltage associated with the actuator, and determining, based on the measuring and using an ADC, whether a diode is present in the actuator and coupled with a correct polarity, is missing, or is present in the actuator and coupled with an incorrect polarity.

11 Claims, 3 Drawing Sheets

(56) References Cited

U.S. PATENT DOCUMENTS

| | | | |
|---|---|---|---|
| 2013/0311120 A1* | 11/2013 | Lin | G01R 19/0084 702/64 |
| 2015/0002135 A1* | 1/2015 | Moyer | G01R 19/14 324/119 |
| 2015/0130750 A1* | 5/2015 | Morrison | G06F 3/0416 345/174 |
| 2016/0118921 A1* | 4/2016 | Tabuchi | H02P 25/034 318/494 |
| 2016/0167610 A1* | 6/2016 | Walker | G01R 31/2813 280/748 |

* cited by examiner

LOW-ENERGY ACTUATOR (LEA) DIODE DETECTION

BACKGROUND

Actuators are components that move or control other components. Actuators receive control signals and are powered by sources of energy. Upon receiving control signals, which may be voltages or currents for a certain duration, the actuators respond by converting the energy into mechanical motion. Such actuators have many applications, including in automobile airbags and active hood systems.

SUMMARY

In one embodiment, the disclosure includes a circuit comprising a CLVS, a LEA coupled to the CLVS, and a peak detector coupled to the CLVS and the LEA, wherein the peak detector is a switch-based peak detector.

In another embodiment, the disclosure includes a diode detection circuit comprising an actuator comprising an inductor and a resistor, and a peak detector coupled to the actuator, comprising a plurality of switches and a capacitor, and configured to couple to an ADC to determine whether a diode is present in the actuator and coupled to the inductor and the resistor with a correct polarity, is missing, or is present in the actuator and coupled to the inductor and the resistor with an incorrect polarity.

In yet another embodiment, the disclosure includes a method comprising closing a first switch for a period of time to provide a current to an actuator, opening the first switch after the period, measuring, after the opening, a voltage associated with the actuator, and determining, based on the measuring and using an ADC, whether a diode is present in the actuator and coupled with a correct polarity, is missing, or is present in the actuator and coupled with an incorrect polarity.

BRIEF DESCRIPTION OF THE DRAWINGS

For a detailed description of various examples, reference will now be made to the accompanying drawings in which.

DETAILED DESCRIPTION

Figure 1:
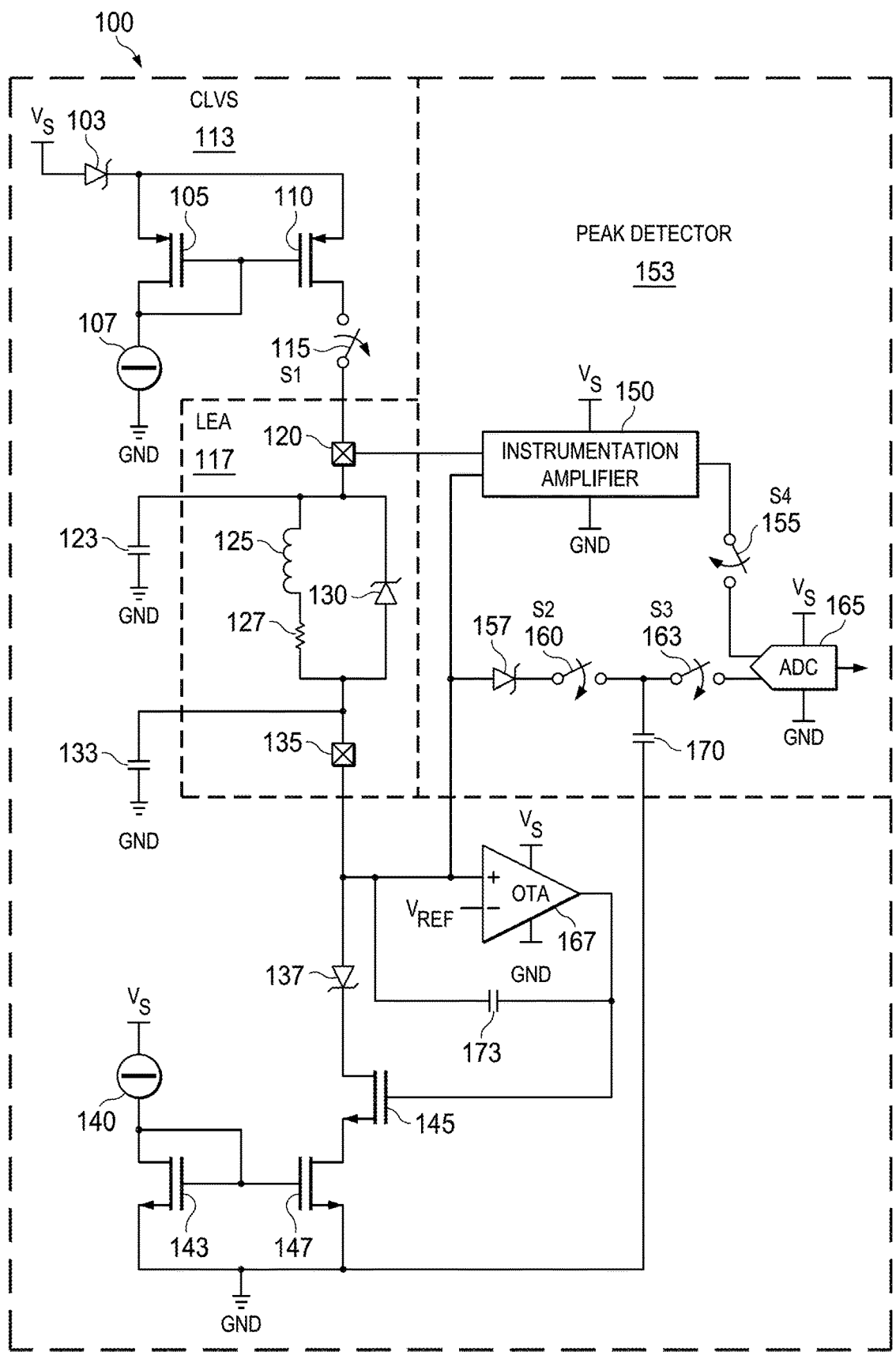
FIG. 1 is a schematic diagram of a circuit according to an embodiment of the disclosure.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ."

The following abbreviations, acronyms, and initialisms apply:

A: amperes
ADC: analog-to-digital converter
ASIC: application-specific integrated circuit
CLVS: current-limited voltage source
GND: ground
I: current
IC: integrated circuit
LEA: low-energy actuator
mA: milliamperes
ms: milliseconds
OTA: operational transconductance amplifier
R: resistance
RL: resistor-inductor
s: seconds
S: switch
V: volts, voltage
$V_{REF}$: reference voltage
$V_S$: source voltage
Ω: ohms
%: percent.

Some actuators employ an inductor coupled to a voltage supply via a switch. In a first state, the switch is closed and allows current to energize the inductor. After a period, the inductor acts essentially as a short so that current flows down from a positive terminal to a negative terminal. In a second state, the switch opens and suddenly reduces current flowing through the inductor. The inductor attempts to resist the sudden reduction in current by using its stored magnetic field energy to create its own voltage. This creates a large negative potential where there was once a positive potential and creates a positive potential where there was once a negative potential. The switch remains at the voltage of the power supply, but maintains contact with the inductor, which pulls down a negative voltage. Because the switch is open and there is no physical connection to allow current to flow, the potential difference may cause electrons to arc across the switch, which is undesirable and may potentially cause a fire.

Freewheeling diodes limit or eliminate that undesired electron arcing. Freewheeling diodes may also be referred to as flyback, snubber, commutating, suppressor, suppression, clamp, and catch diodes. Freewheeling diodes eliminate freewheeling, or flyback, which is a sudden voltage spike across an inductive load when a supply to the inductive load is suddenly reduced. Specifically, freewheeling diodes allow the inductor to draw current from itself in a continuous loop until the energy is dissipated through losses in the diode, a resistor, and wires. The total dissipation time is typically a few milliseconds.

A LEA is low energy because it requires a small energy source, for instance a current less than 1.5 A for 0.7 ms. The LEA comprises an inductor, a resistor, and a diode. The inductor and the resistor are in series with each other and together are in parallel with the diode. The diode may be a Schottky diode or another suitable diode. A Schottky diode has a low forward voltage drop and a fast switching action. The diode with correct freewheeling polarity comprises a cathode coupled to the inductor and an anode coupled to the resistor. The cathode is an n-type of the diode, and the anode is a p-type portion of the diode. The diode may function as a freewheeling diode to limit or eliminate freewheeling as described above.

Due to manufacturing errors, the diode may be missing in the LEA. Alternatively, the diode may be coupled with an incorrect polarity so that the cathode is coupled to the resistor and the anode is coupled to the inductor. Those manufacturing errors may cause the LEA to malfunction and thus potentially cause a fire. There is therefore a need for a diode detection circuit that detects such errors so that those errors may be corrected before the LEA is integrated into an ASIC or an IC of a larger system such as an automobile. That detection may be performed using lower currents in the milliamp range.

In one approach to a diode detection circuit, a diode detection circuit uses the freewheeling from the inductor detection. The diode detection circuit may be referred to as a high-side diode detection circuit because the CLVS is a high-side CLVS. The term "high-side" indicates that a dominant current comes from the top, or high side, of the CLVS. The CLVS may use a comparator and a digital filter to reduce noise. However, a fast control signal may undesirably pull the comparator high, causing a glitch in the comparator, which requires filtering. In addition, frequency compensation is complex because capacitors may need to be high-voltage capacitors, meaning capacitors rated for a voltage of about 20 V to about 40 V. Furthermore, the CLVS needs two voltage supplies, a first voltage supply for the CLVS and second voltage supply for OTAs. When the first voltage supply and the second voltage supply are improperly balanced or missing, for instance when the first voltage supply is greater than the second voltage supply or when either the first voltage supply or the second voltage supply is missing, then the diode detection circuit may fail.

Disclosed herein are embodiments for an improved diode detection circuit. The CLVS is a low-side CLVS instead of a high-side CLVS. The CLVS may comprise one OTA and not two OTAs. Low-voltage capacitors may implement frequency compensation. Because there is one OTA in some embodiments, the CLVS may need only one voltage supply, which reduces the chance of imbalanced voltage supplies and of a missing voltage supply, thus reducing the chance of failure of the diode detection circuit. The OTA may comprise a low-voltage compensation capacitor instead of a high-voltage compensation capacitor. The peak detector is switch-based and may couple to an ADC that already exists in a broader circuit such as an ASIC or an IC so that there is no need for a comparator, a digital filter, or a latch. Without a comparator, there is no chance of comparator glitches and there is no need for filtering those glitches. The ADC detects an average voltage across a capacitor and converts that value to a digital value. By using logic gates, that value is compared to a pre-determined digital value or range of digital values, which obviates the need for status bits to indicate negative values or positive values. For all of those reasons, the diode detection circuit has an improved detectability and a reduced size, complexity, and cost.

FIG. 1 is a schematic diagram of a diode detection circuit 100 according to an embodiment of the disclosure. The diode detection circuit 100 generally comprises a CLVS 113, a LEA 117, and a peak detector 153. The diode detection circuit 100 may be referred to as a low-side diode detection circuit because the CLVS 113 is a low-side CLVS. The term "low-side" indicates that a dominant current comes from the bottom, or low side, of the CLVS 113. In this case, the low side refers to the side of the diode detection circuit 100 between a ground denoted as GND and the LEA. The dominant current stays on while a non-dominant current does not stay on due to S1 115.

The CLVS 113 comprises diodes 103, 137; p-type transistors 105, 110; current sources 107, 140; a switch S1 115; capacitors 123, 133, 173; n-type transistors 143, 145, 147; and an OTA 167. The CLVS 113 may function in a way similar to that described in U.S. Pat. No. 8,045,317 by Sri N. Easwaran and titled "Current Limited Voltage Source With Wide Input Current Range," which is incorporated by reference. The current source 140 and the transistors 143, 145, 147 form a current mirror, which ensures a constant current flowing from the current mirror to the LEA 117. The diodes 103, 137 may be Schottky diodes or other suitable diodes. The current sources 107 may produce a current of about 40 mA, and the current source 140 may produce a current of about 20 mA. The capacitors 123, 133 dampen an RL load of the LEA 117. The OTA 167 regulates the pin 135 to a reference voltage, $V_{REF}$, which may be about 4.8 V, in order to use a voltage source denoted as $V_S$. The capacitor 173 provides frequency compensation for the OTA 167. Because of the architecture of the diode detection circuit 100 and because of the location of the capacitor 173 in the diode detection circuit 100, the capacitor 173 may be a low-voltage capacitor, meaning a capacitor rated for a voltage of about 10 V or less.

The LEA 117 comprises pins 120, 135; an inductor 125; a resistor 127; and a diode 130. The inductor 125 and the resistor 127 form an actuator, and the diode 130 limits or eliminates electron arcing across S1 115 when S1 is open. The resistor 127 may be referred to as a squib resistor, which is used in automobile airbag applications as a trigger resistor to enable an airbag to inflate when specified conditions are met. The resistor may have a resistance from about 1 Ω to about 6 Ω. The diode 130 may be a Schottky diode or another suitable diode. The diode 130 has a negligible voltage drop for a current of about 20 mA.

The peak detector 153 comprises a diode 157, an instrumentation amplifier 150, a switch S2 160, a switch S3 163, a switch S4 155, an ADC 165, and a capacitor 170. The diode 157 may be a Schottky diode or another suitable diode. The instrumentation amplifier 150 measures the resistance of the resistor 127 using $V_{REF}$. S2 160, S3 163, and S4 155 detect whether the diode 130 is coupled with a correct polarity, is missing, or is coupled with an incorrect polarity. The correct polarity is when a cathode of the diode 130 is coupled to the inductor 125 and when an anode of the diode 130 is coupled to the resistor 127, and the incorrect polarity is when the cathode is coupled to the resistor 127 and the anode is coupled to the inductor 125.

The diode 103, the current source 140, the OTA 167, the instrumentation amplifier 150, and the ADC 165 couple to $V_S$, which may be about 40 V. The current source 107; the capacitors 123, 133; the transistors 143, 147; the OTA 167; the instrumentation amplifier 150; and the ADC 165 couple to GND. The OTA 167 further couples to $V_{REF}$. Though shown with the diode detection circuit 100, $V_S$, $V_{REF}$, GND, and the ADC 165 may be separate from the diode detection circuit 100. Thus, the ADC 165 may couple to any suitable voltage source and ground.

There are at least two phases of detection and measurement of the diode detection circuit 100. In a first phase, a resistance measurement phase, the instrumentation amplifier 150 measures a resistance of the resistor 127. In a second phase, a diode detection phase, the peak detector 153 detects the existence and polarity of the diode 130.

Figure 2:
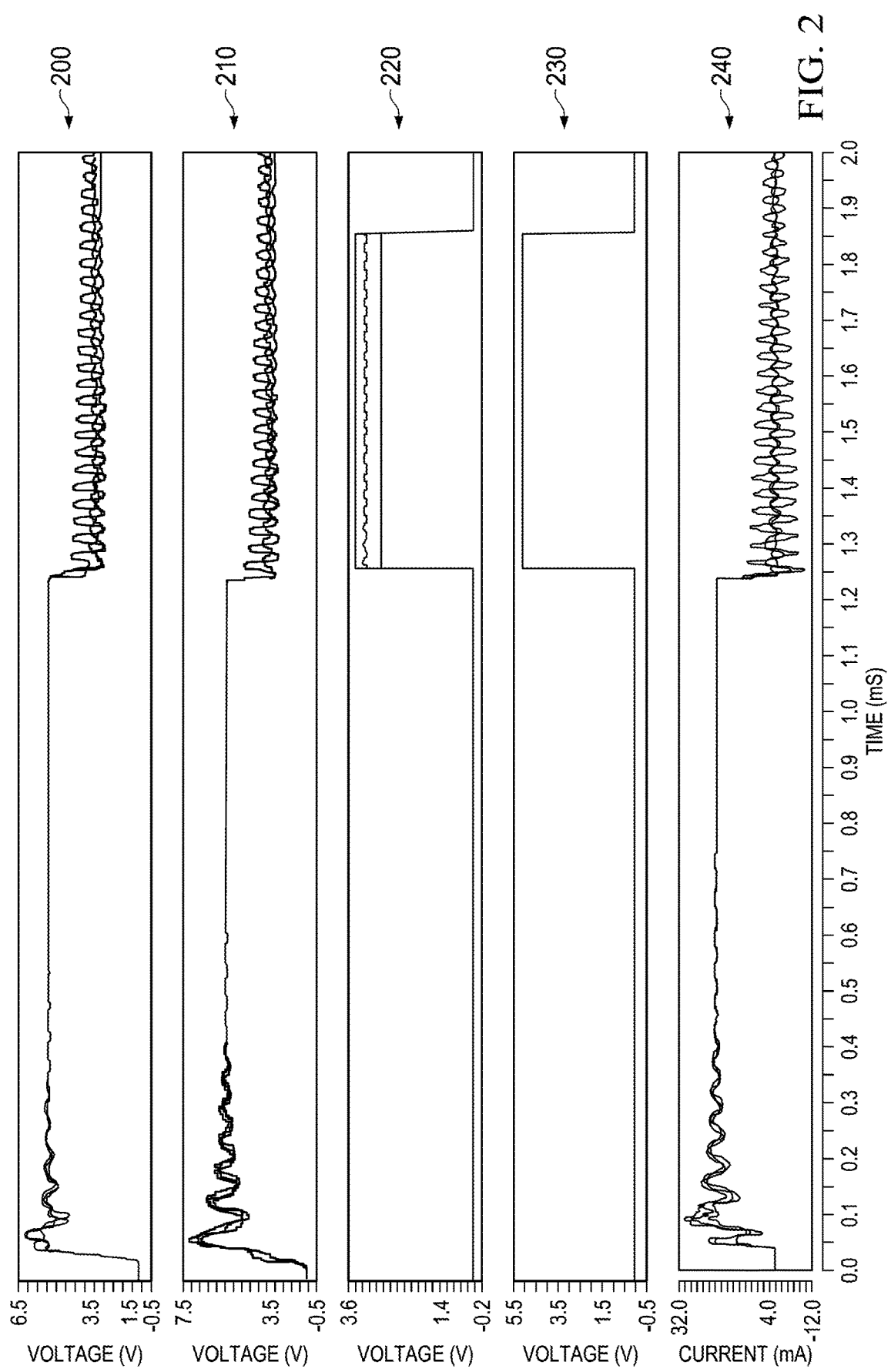
FIG. 2 shows examples of graphs of simulated waveforms during the resistance measurement phase and the diode detection phase of the diode detection circuit in FIG. 2.

FIG. 2 shows examples of graphs 200-240 of simulated waveforms during the resistance measurement phase and the diode detection phase of the diode detection circuit 100 in FIG. 1. The graph 200 is a graph of the voltage of the pin 135; the graph 210 is a graph of the voltage at the pin 120; the graph 220 is a graph of the voltage at the output of S2 160 or the voltage across the capacitor 170; the graph 230 is a graph of input control voltages of S1 115, S2 160, S3 163, S4 155; and the graph 240 is a graph of a current through the inductor 125. The x-axes of the graphs 200-240 are time in milliseconds, the y-axes of the graphs 200-230 are voltages in volts, and the y-axis of the graph 240 is current in milliamps. From 0 ms to about 1.26 ms the graphs 200-240 show the first phase, and from about 1.26 ms to about 1.86 ms, the graphs 200-240 show the second phase.

During the first phase, the graph 230 shows that S1 115 and S4 155 are on, or closed, because they are on when their input control voltages are low. At the same time, the graph 230 shows that S2 160 and S3 163 are off, or open, because they are off when their input control voltages are low. As a result, current from the current sources 107, 140 flows from $V_S$ to the pin 135 and from the pin 135 to GND. That creates a first voltage at the pin 120 and a second voltage at the pin 135, which the instrumentation amplifier 150 detects. In addition, the instrumentation amplifier 150 knows the value of the current, which is pre-configured. With the values of the first voltage, the second voltage, and the current and using Ohm's Law, which holds that R=V/I, the instrumentation amplifier 150 calculates the resistance of the resistor 127.

During the second phase, the graph 230 shows that S1 115 and S4 155 are off because they are off when their input control voltages are high. At the same time, the graph 230 shows that S2 160 and S3 163 are on because they are on when their input control voltages are high. As a result, current does not flow from the current source 107 to the rest of the diode detection circuit 100, though current continues to flow from the current source 140. The graphs 200-210 show that that produces ringing at the pins 120, 135. Ringing is oscillation of a signal.

In addition to the ringing at the pins 120, 135, the inductor 125 experiences freewheeling. During freewheeling, whether the diode 130 has a correct polarity, is missing, or has an incorrect polarity dictates an amount of undershoot at the pin 135. The undershoot passes through the diode 157 and S3 163 to produce an average voltage across the capacitor 170. The ADC 165 detects and converts that average voltage to a digital value and compares that digital value to digital values of pre-determined voltages determined from prior testing. The graph 220 shows that a value of about 3.6 V indicates that the diode 130 is coupled with a correct polarity, a value of about 3 V indicates that the diode 130 is missing, and a value of about 2.4 V indicates that the diode is coupled with an incorrect polarity. In other words, a higher voltage indicates a correct polarity, an intermediate voltage indicates a missing diode, and a lower voltage indicates an incorrect polarity.

The ADC 165 may compare the average voltage to the pre-determined voltages within a margin of error, for instance about 5%, and using absolute values. The diode detection circuit 100 may use any suitable voltage values for $V_S$, $V_{REF}$, and the current sources 107, 140. In that case, the ADC 165 may detect and convert any suitable average voltage across the capacitor and may use any suitable digital values of pre-determined voltages.

During manufacturing, a manufacturer may perform the first phase to determine whether a resistance of the resistor 127 is within tolerance. The operator may then perform the second phase to determine whether the diode 130 is coupled with a correct polarity, is missing, or is coupled with an incorrect polarity. If the resistance of the resistor 127 is within tolerance and the diode 130 is coupled with a correct polarity, then the manufacturer may integrate the diode detection circuit into an ASIC or an IC of a larger system such as an automobile, or the manufacturer may read the diode detection circuit for sale. Otherwise, if the resistance of the resistor 127 is not within tolerance, if the diode 130 is missing, or if the diode 130 is coupled with an incorrect polarity, then the manufacturer may salvage or dispose of the diode detection circuit.

Figure 3:
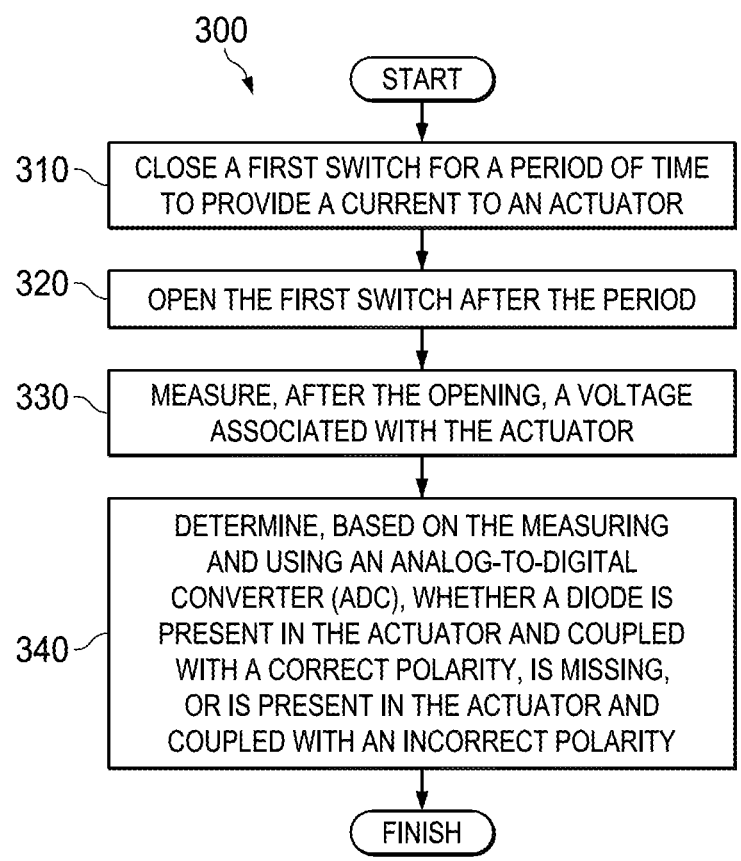
FIG. 3 is a flowchart illustrating a method of diode detection according to an embodiment of the disclosure.

FIG. 3 is a flowchart illustrating a method 300 of diode detection according to an embodiment of the disclosure. A manufacturer of the diode detection circuit 100 or another entity may perform the method 300 on the diode detection circuit 100. At step 310, a first switch is closed for a period of time to provide a current to an actuator. For instance, S1 115 is closed for the first phase described above to provide a current to the LEA 117. At step 320, the first switch is opened after the period. For instance, S1 115 is opened for the second phase described above. At step 330, after the opening, a voltage associated with the actuator is measured. For instance, the ADC 165 measures a voltage at S2 160. Finally, at step 340, based on the measuring and using an ADC, it is determined whether a diode is present in the actuator and coupled with a correct polarity, is missing, or is present in the actuator and coupled with an incorrect polarity. For instance, the ADC 165 determines whether the diode 130 is present in the LEA 117 and coupled with a correct polarity, is missing, or is present in the LEA 117 and coupled with an incorrect polarity.

A first component is directly coupled to a second component when there are no intervening components, except for a line, a trace, or another medium between the first component and the second component. The first component is indirectly coupled to the second component when there are intervening components other than a line, a trace, or another medium between the first component and the second component. The termed "coupled" and its derivatives includes both directly coupled and indirectly coupled. The use of the term "about" means a range including ±10% of the subsequent number, unless otherwise stated.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A diode detection circuit comprising:
    an actuator having a high side and a low side and including an inductor and a resistor;
    a current limited voltage source coupled to the high side of the actuator through a switch, and including a current mirror coupled to the low side of the actuator; and
    a peak detector coupled to the actuator, the peak detector including switches and a capacitor, and configured to be coupled to an analog-to-digital converter (ADC) to determine whether:
    a diode is present in the actuator and coupled to the inductor and the resistor with a correct polarity,
    a diode is missing, or
    a diode is present in the actuator and coupled to the inductor and the resistor with an incorrect polarity.

2. The diode detection circuit of claim 1, in which the peak detector includes the ADC.

3. The diode detection circuit of claim 1, in which the ADC is external to the diode detection circuit.

4. The diode detection circuit of claim 1, in which the diode detection circuit is configured to produce a first voltage indicating that the diode is coupled with the correct polarity, a second voltage indicating that the diode is missing, and a third voltage indicating that the diode is coupled with the incorrect polarity.

5. The diode detection circuit of claim 1, in which the diode detection circuit is configured to couple to only one voltage supply.

6. The diode detection circuit of claim 1, in which the switches include a first switch configured to be coupled to the capacitor and the ADC.

7. The diode detection circuit of claim 6, in which the switches include a second switch configured to be coupled to the first switch.

8. A method comprising:
closing a first switch for a period of time to provide a current to an actuator;
opening the first switch after the period;
measuring, after the opening, a voltage associated with the actuator; and
determining, based on the measuring and using an analog-to-digital converter (ADC), whether a diode is present in the actuator and coupled with a correct polarity, is missing, or is present in the actuator and coupled with an incorrect polarity.

9. The method of claim 8, in which a first voltage indicates that the diode is coupled with the correct polarity, a second voltage indicates that the diode is missing, and a third voltage indicates that the diode is coupled with the incorrect polarity.

10. The method of claim 8, including determining, before the opening, whether a resistance of a resistor in the actuator is within tolerance.

11. The method of claim 10, including:
integrating the actuator into an integrated circuit (IC) when the resistance is within the tolerance and when the diode is coupled with the correct polarity; and
salvaging or disposing of the actuator when the resistance is not within the tolerance, when the diode is missing, or when the diode is present in the actuator and coupled with the incorrect polarity.

* * * * *